(12) United States Patent
Hsieh et al.

(10) Patent No.: US 8,019,094 B2
(45) Date of Patent: Sep. 13, 2011

(54) AUDIO PROCESSING SYSTEM WITH FUNCTION OF AUTOMATIC GAIN CONTROL AND METHOD THEREOF

(75) Inventors: Kuan-Hong Hsieh, Guangdong (CN); Wen-Sheng Tsai, Guangdong (CN); Wen-Chuan Lian, Guangdong (CN); Xiao-Guang Li, Guangdong (CN)

(73) Assignees: Hong Fu Jin Precision Industry (Shen Zhen) Co., Ltd., Longhua Town, Bao'an District, Shenzhen, Guangdong Province (CN); Hon Hai Precision Industry Co., Ltd., Tucheng Dist., New Taipei (TW)

(*) Notice: Subject to any disclaimer, the term of this patent is extended or adjusted under 35 U.S.C. 154(b) by 1344 days.

(21) Appl. No.: 11/557,955

(22) Filed: Nov. 8, 2006

(65) Prior Publication Data

US 2007/0110260 A1   May 17, 2007

(30) Foreign Application Priority Data

Nov. 11, 2005   (CN) .......................... 2005 1 0101240

(51) Int. Cl.
*H03G 3/00* (2006.01)
*G06F 17/00* (2006.01)

(52) U.S. Cl. .......................... 381/107; 381/109; 700/94
(58) Field of Classification Search .................. 381/107, 381/109, 103; 700/94
See application file for complete search history.

(56) References Cited

U.S. PATENT DOCUMENTS

| | | | |
|---|---|---|---|
| 5,945,988 A * | 8/1999 | Williams et al. | 715/747 |
| 2005/0251273 A1 * | 11/2005 | Bychowsky et al. | 700/94 |
| 2006/0106472 A1 * | 5/2006 | Romesburg et al. | 700/94 |

* cited by examiner

*Primary Examiner* — Vivian Chin
*Assistant Examiner* — Douglas Suthers
(74) *Attorney, Agent, or Firm* — Winston Hsu; Scott Margo

(57) ABSTRACT

The present invention relates to an audio processing system with function of automatic gain control and method thereof. The method includes steps of: receiving a playing command to play an audio file; reading a genre type of the audio file from a tag of the audio file; reading a genre gain value of the genre type from a gain setting table stored in a storage unit; decoding the audio file and generating digital audio signals; converting the digital audio signals to analog audio signals; and signaling a gain amplifier to amplify the analog audio signals by the genre gain value, thereby sounds corresponding to the analog audio signals amplified is proper to a listener's hearing.

9 Claims, 6 Drawing Sheets

AUDIO PROCESSING SYSTEM WITH FUNCTION OF AUTOMATIC GAIN CONTROL AND METHOD THEREOF

BACKGROUND OF THE INVENTION

1. Field of the Invention

The present invention relates to an audio processing system with function of automatic gain control and method thereof, especially to an audio processing system with function of automatic gain control according to a genre type of an audio file and method thereof.

2. Description of Related Art

Studies show that an increased pace of living makes people more intense. Therefore, enjoying music becomes one of many relaxing activities for people. Apparently, the relaxing activity of enjoying music is seen everywhere whether during work, commuting, or resting.

According to an international standard, each audio file includes a tag for storing characteristic information of the audio file. For example, an MP3 file has a tag, namely an ID3, which stores title, artist, album, genre type, and other aspect of the MP3 file. With respect to the genre type, it is used for indicating a style of the audio file, for example, country, dance, disco, rock, jazz, metal, and so on. Audio signals of different genre types have different beat and/or tempos, thereby after being amplified by an identical gain value, the audio signals of different genre types have different audio energies. In order that a listener may enjoy music most comfortably, audio signals of audio files need to be amplified by the gain amplifier with different gain values. However, audio players available in the market can't automatically adjust a default gain value of the gain amplifier. So the listener needs to manually adjust the default gain value of the gain amplifier, an annoying task that should be avoided.

Therefore, a heretofore unaddressed need exists in the industry to overcome the aforementioned deficiencies and inadequacies.

SUMMARY OF THE INVENTION

In order to solve said problems, the present invention provides an audio processing system with function of automatic gain control and method thereof. The audio processing system automatically adjusts a current gain value of the gain amplifier according to a genre type of an audio file, thereby audio energy of audio signals amplified by the gain amplifier is proper to a user's hearing.

The audio processing system with a function of automatic gain control, includes a storage unit, a processing unit, a decoding unit, a digital/analog converter and a gain managing unit. The storage unit stores a plurality of audio files and a gain setting table. The gain setting lists a plurality of genre types with a genre gain value of the genre type. The processing unit fetches an audio file from the storage unit after receiving a playing command to play the audio file. The decoding unit decodes the audio file and generates digital audio signals. The digital/analog converter converts the digital audio signals to analog audio signals. The gain managing unit includes an identifying module, an obtaining module, a gain adjusting module and an updating module. The identifying module reads a genre type of the audio file fetched from a tag of the audio file. The obtaining module reads a genre gain value of the genre type from the gain setting table. The gain adjusting module signals a gain amplifier to amplify the analog audio signals received from the digital/analog converter by the genre gain value read. The updating module updates the default gain value with the genre gain value.

The audio processing system with a function of automatic gain control, includes a storage unit, a processing unit, a decoding unit, a digital/analog converter and a gain managing unit. The storage unit stores a plurality of audio files and a gain setting table. The gain setting lists a plurality of genre types with a genre gain value of the genre type. The processing unit fetches an audio file from the storage unit after receiving a playing command to play the audio file. The decoding unit decodes the audio file and generates digital audio signals. The digital/analog converter converts the digital audio signals to analog audio signals. The processing unit includes an identifying module, an obtaining module, a gain adjusting module and an updating module. The identifying module reads a genre type of the audio file fetched from a tag of the audio file. The obtaining module reads a genre gain value of the genre type from the gain setting table. The gain adjusting module signals a gain amplifier to amplify the analog audio signals received from the digital/analog converter by the genre gain value read. The updating module updates the default gain value with the genre gain value.

The automatic gain control method of an audio processing system includes the steps of: receiving a playing command to play an audio file; reading a genre type of the audio file from a tag of the audio file; reading a genre gain value of the genre type from a gain setting table stored in a storage unit; decoding the audio file and generating digital audio signals; converting the digital audio signals to analog audio signals; and signaling a gain amplifier to amplify the analog audio signals by the genre gain value.

Other systems, methods, features, and advantages will be or become apparent to one with skill in the art upon examination of the following drawings and detailed description. It is intended that all such additional systems, methods, features, and advantages be included within this description, be within the scope of the present invention, and be protected by the accompanying claims.

DETAILED DESCRIPTION OF THE INVENTION

The automatic gain control function of the present invention can be applied in a car stereo system or portable electrical devices such as an MP3 player, an electronic book, a mobile telephone, and so on. The following detailed descriptions of preferred embodiments are made with reference to the attached drawings.

Figure 1:
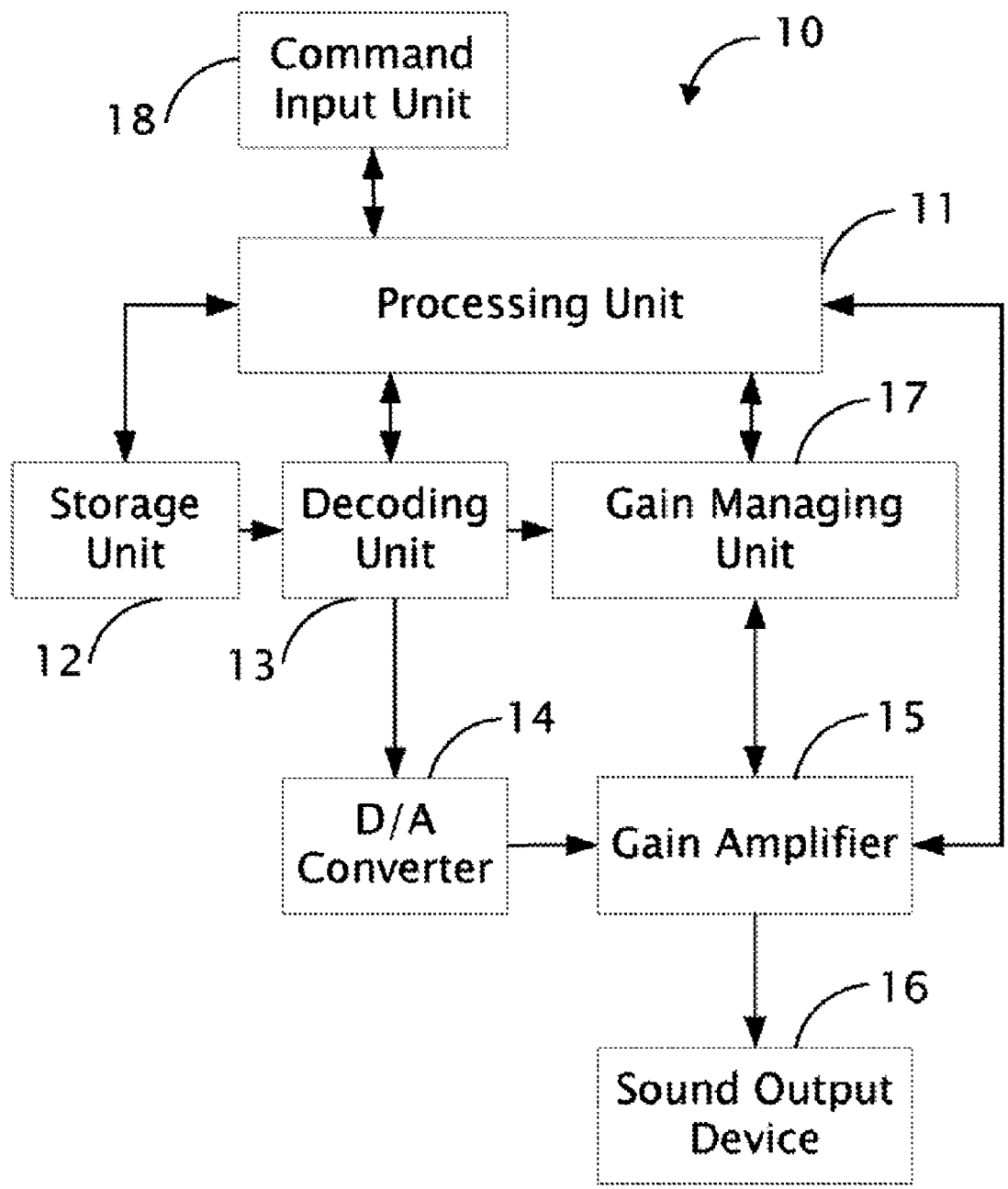
FIG. 1 is a block diagram of a hardware infrastructure of an audio processing system in accordance with a preferred embodiment of the present invention.

FIG. 1 is a block diagram of a hardware infrastructure of the audio processing system 10 in accordance with a preferred embodiment of the present invention. The audio processing system 10 includes a processing unit 11, a storage unit 12, a decoding unit 13, a digital/analog (D/A) converter 14, a gain amplifier 15, a sound output device 16, and a command input unit 18.

The storage unit 12 stores a plurality of audio files, a default gain value, a decoding program, and a gain setting table. The gain setting table lists (or has) a plurality of genre types, with a corresponding genre gain value for each of the genre types. The storage unit 12 can be a flash storage, a hard disk, and the like. The processing unit 11 controls components of the system 10. The processing unit 11 can be a digital signal processor (DSP), a central processing unit (CPU), and the like.

The command input unit 18 generates control commands after receiving operational inputs. The control commands include a playing command to play an audio file, and an adjusting command to adjust the default gain value stored in the storage unit 12. After receiving the playing command, the processing unit 11 fetches the audio file to be played from the storage unit 12.

The decoding unit 13 invokes the decoding program stored in the storage unit 12, decodes the audio file fetched by the processing unit 11, generates digital audio signals and sends the digital audio signals to the D/A converter 14. The D/A converter 14 converts the digital audio signals generated by the decoding unit 13 to analog audio signals.

The gain amplifier 15 amplifies the analog audio signals converted by the D/A converter 14 according to the default gain value stored in the storage unit 12. The sound output device 16 produces sounds corresponding to the analog audio signals amplified. The sound output device 16 can be an earphone or a speaker.

Figure 2:
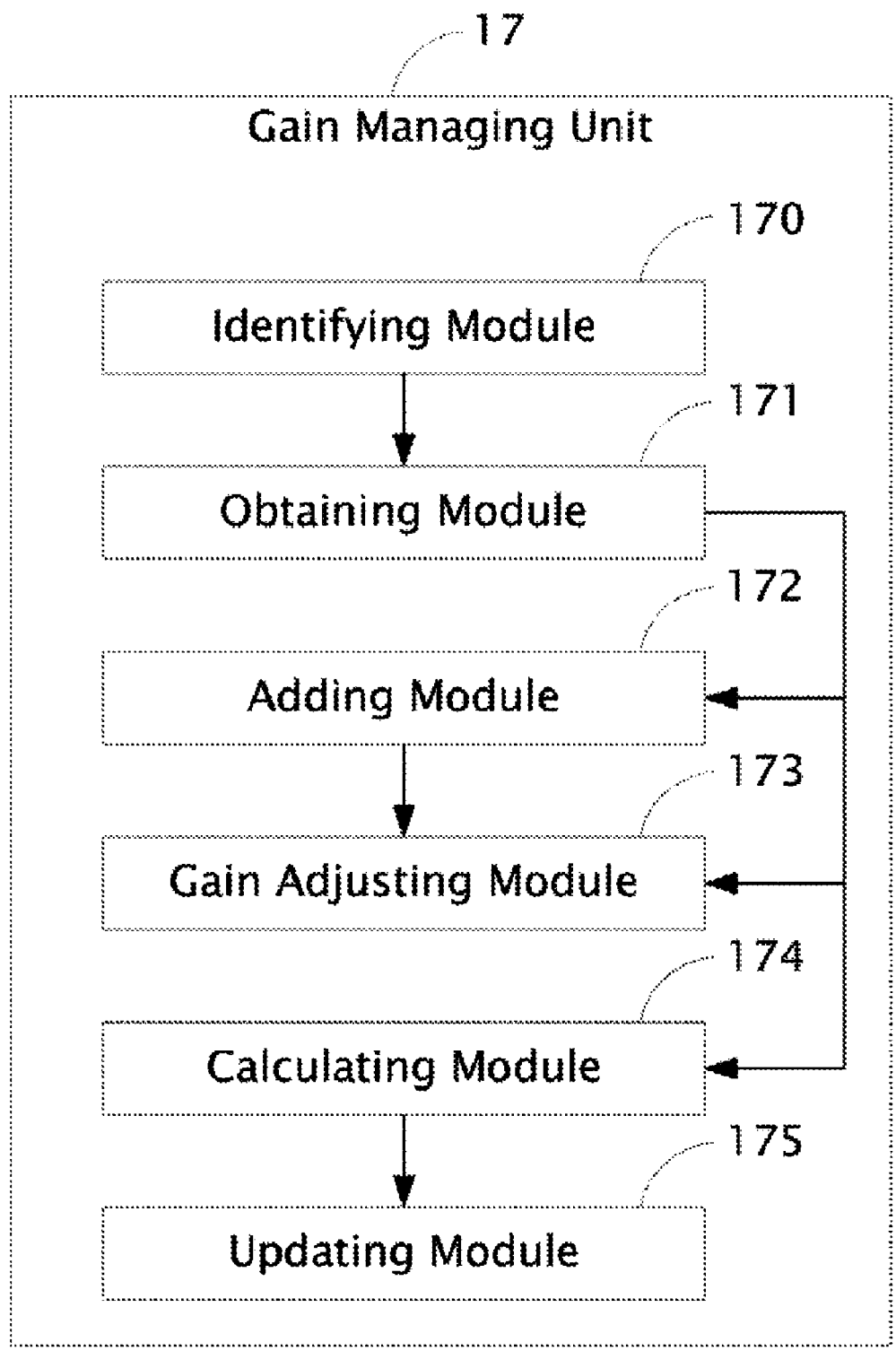
FIG. 2 is a schematic diagram of main function modules of a gain managing unit of FIG. 1.

The audio processing system 10 further includes a gain managing unit 17 integrated with the processing unit 11. Referring to FIG. 2, the gain managing unit 17 includes an identifying module 170, an obtaining module 171, an adding module 172, a gain adjusting module 173, a calculating module 174, and an updating module 175.

Figure 3:
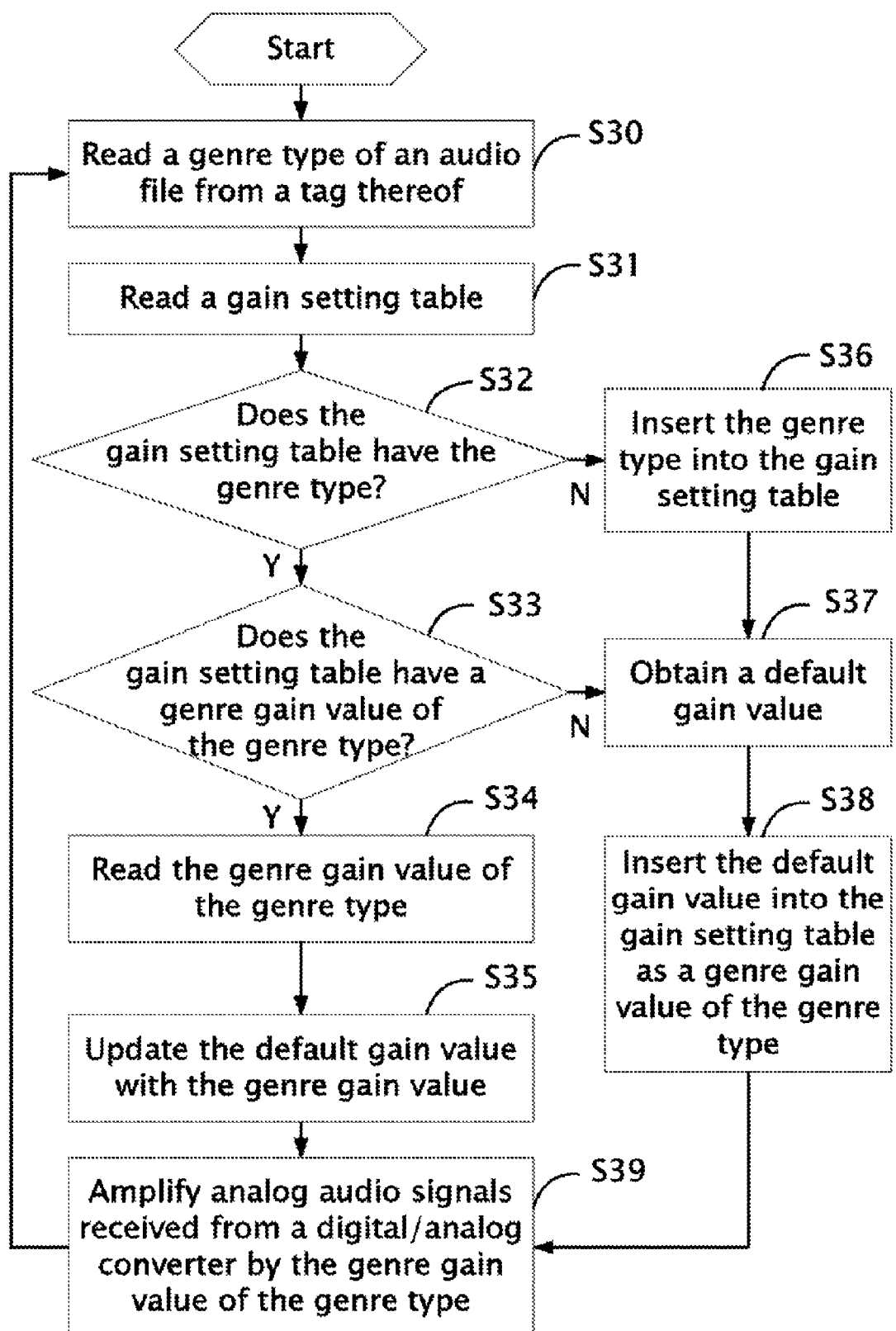
FIG. 3 is a flowchart of a preferred automatic gain control method by utilizing the audio processing system of FIG. 1.

FIG. 3 is a flowchart of a preferred automatic gain control method by utilizing the audio processing system 10 of FIG. 1. Referring to FIG. 2, the processing unit 11 signals a requesting command to the gain managing unit 17 while fetching an audio file to play, in step S30, the identifying module 170 reads the genre type of the audio file from the tag of the audio file.

In step S31, the obtaining module 171 reads the gain setting table stored in the storage unit 12. In step S32, the obtaining module 171 detects whether the gain setting table lists the genre type of the audio file. If the gain setting table does not list the genre type, in step S36, the adding module 172 inserts the genre type into the gain setting table, and then the procedure goes to step S37.

In step S32, if the gain setting table lists the genre type, in step S33, the obtaining module 171 determines whether the gain setting table have a genre gain value of the genre type.

If the gain setting table does not list the genre gain value of the genre type, in step S37, the obtaining module 171 reads the default gain value stored in the storage unit 12. In step S38, the adding module 172 inserts the default gain value into the gain setting table as the genre gain value of the genre type, and then the procedure goes to step S35.

In step S33, if the gain setting table lists the genre gain value of the genre type, in step S34, the obtaining module 171 reads the genre gain value of the genre type. In step S35, the gain adjusting module 173 signals the gain amplifier 15 to amplify the analog audio signals received from the D/A converter 14 by the genre gain value.

In step S39, the updating module 175 updates the default gain value with the genre gain value of the genre type. The step S30 to step S39 is performed recursively until the audio signal processing system 10 is turned-off.

Figure 4:
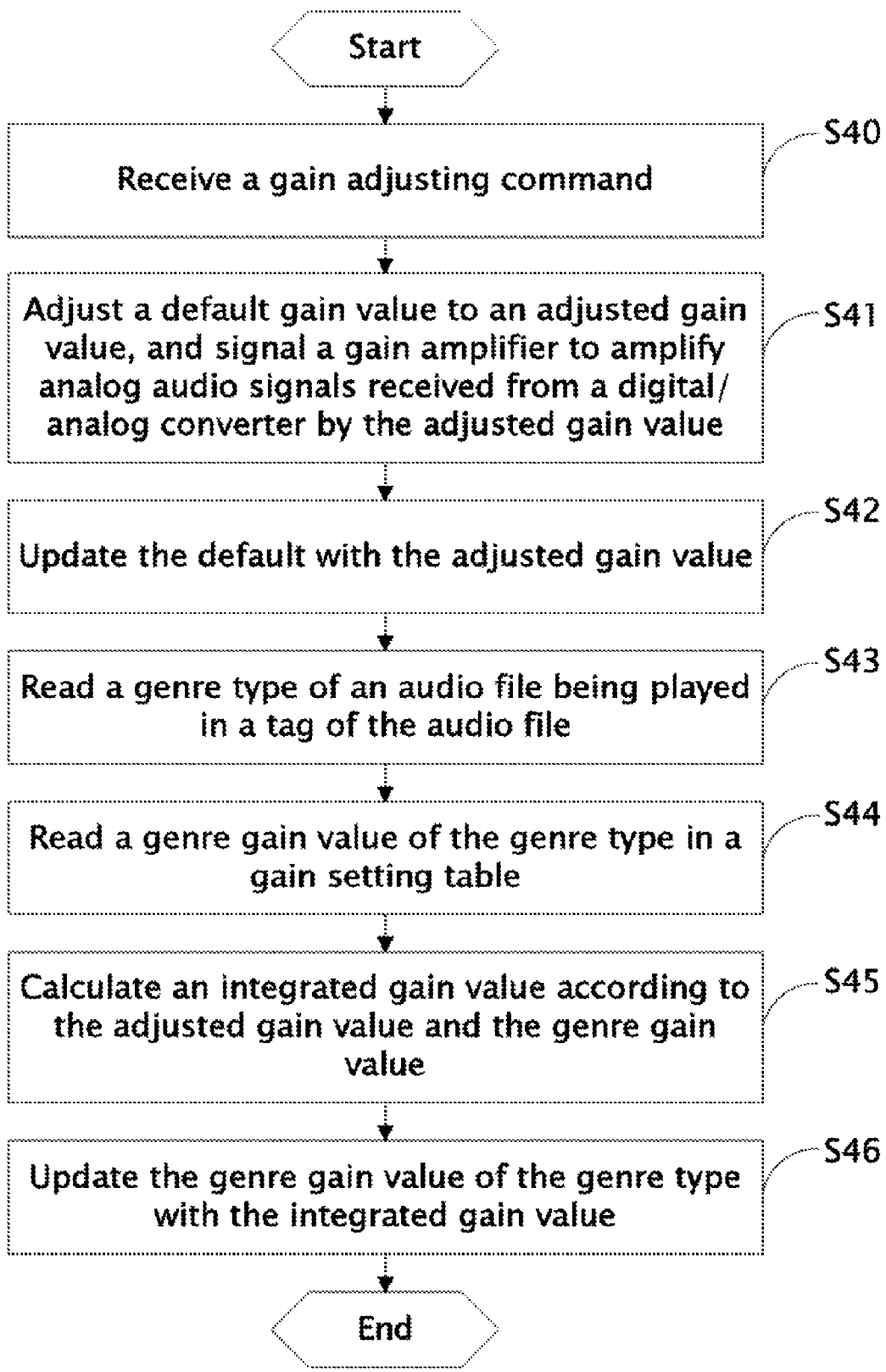
FIG. 4 is a flowchart of a preferred method of regenerating a genre gain value of a genre type by utilizing the audio processing system of FIG. 1.

FIG. 4 is a flowchart of a preferred method of updating the genre gain value of the genre type by utilizing the audio processing system 10 of FIG. 1. Referring to FIG. 2, in step S40, the gain managing unit receives the adjusting command to adjust the default gain value. In step S41, the gain adjusting module 173 adjusts the default gain value stored in the storage unit 12 to an adjusted gain value, and signals the gain amplifier 15 to amplify the analog audio signals received from the D/A converter 14 by the adjusted gain value. In step S42, the updating module 175 updates the default gain value stored in the storage unit 12 with the adjusted gain value.

In step S43, the identifying module 170 reads the genre type of an audio file being played from the tag of the audio file. In step S44, the obtaining module 171 reads the genre gain value of the genre type from the gain setting table.

In step S45, the calculating module 174 assigns a weight value respectively to the genre gain value and the adjusted gain value, multiplies the genre gain value and the adjusted gain value by the corresponding weight value assigned, thereby obtaining two products, and sums the two products to obtain an integrated gain value.

In step S46, the updating module 175 updates the genre gain value of the genre type in the gain setting table with the integrated gain value. In an alternative embodiment, the updating module 175 directly updates the genre gain value of the genre type in the gain setting table with the adjusted gain value.

Figure 5:
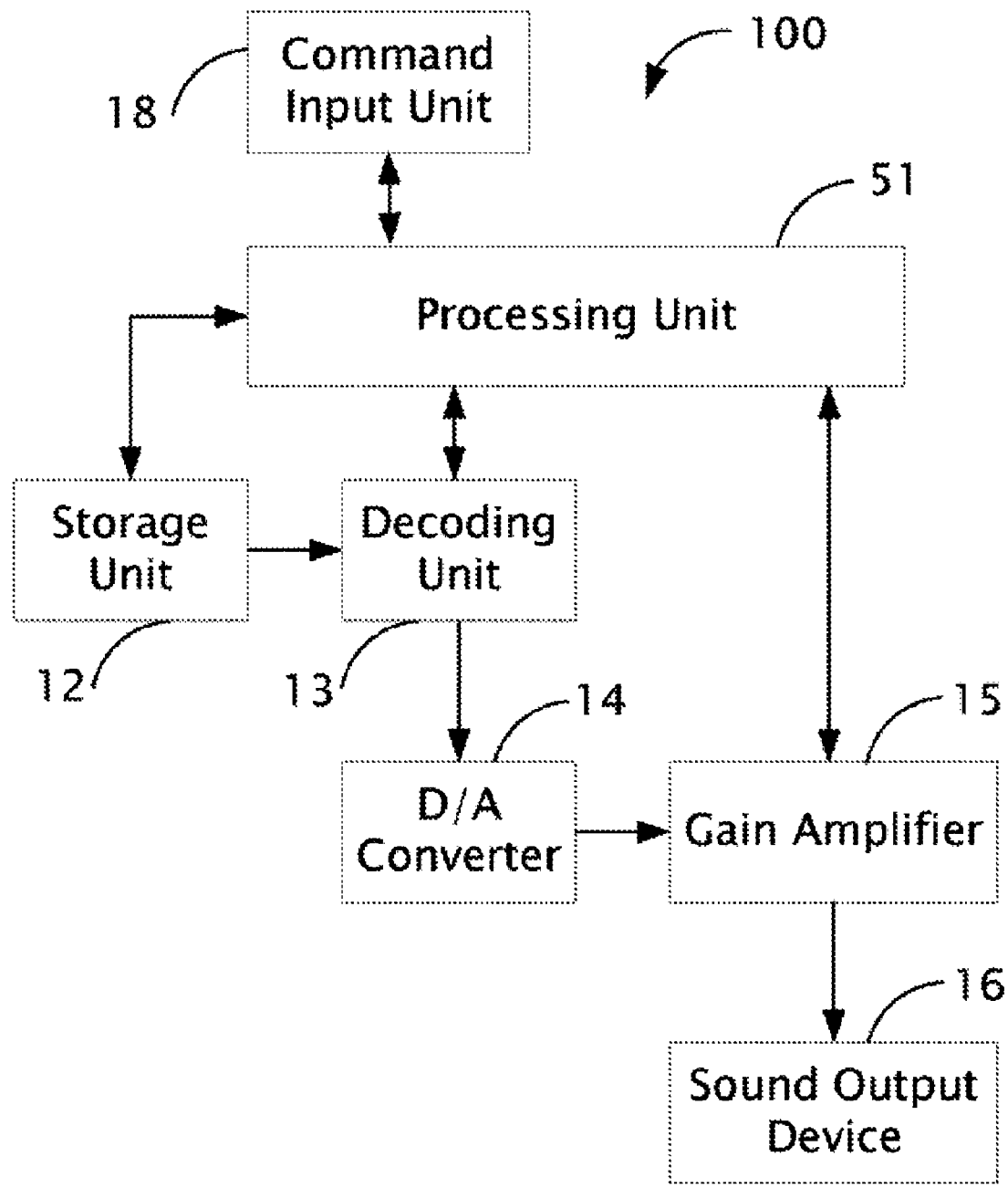
FIG. 5 is a block diagram of a hardware infrastructure of an audio processing system in accordance with an alternative preferred embodiment of the present invention.

FIG. 5 is a block diagram of a hardware infrastructure of an audio processing system 100 in accordance with an alternative embodiment of the present invention. The audio processing system 100 of the alternative embodiment is the same as that of the preferred embodiment, except that the gain managing unit 17 is configured in the processing unit 51.

Figure 6:
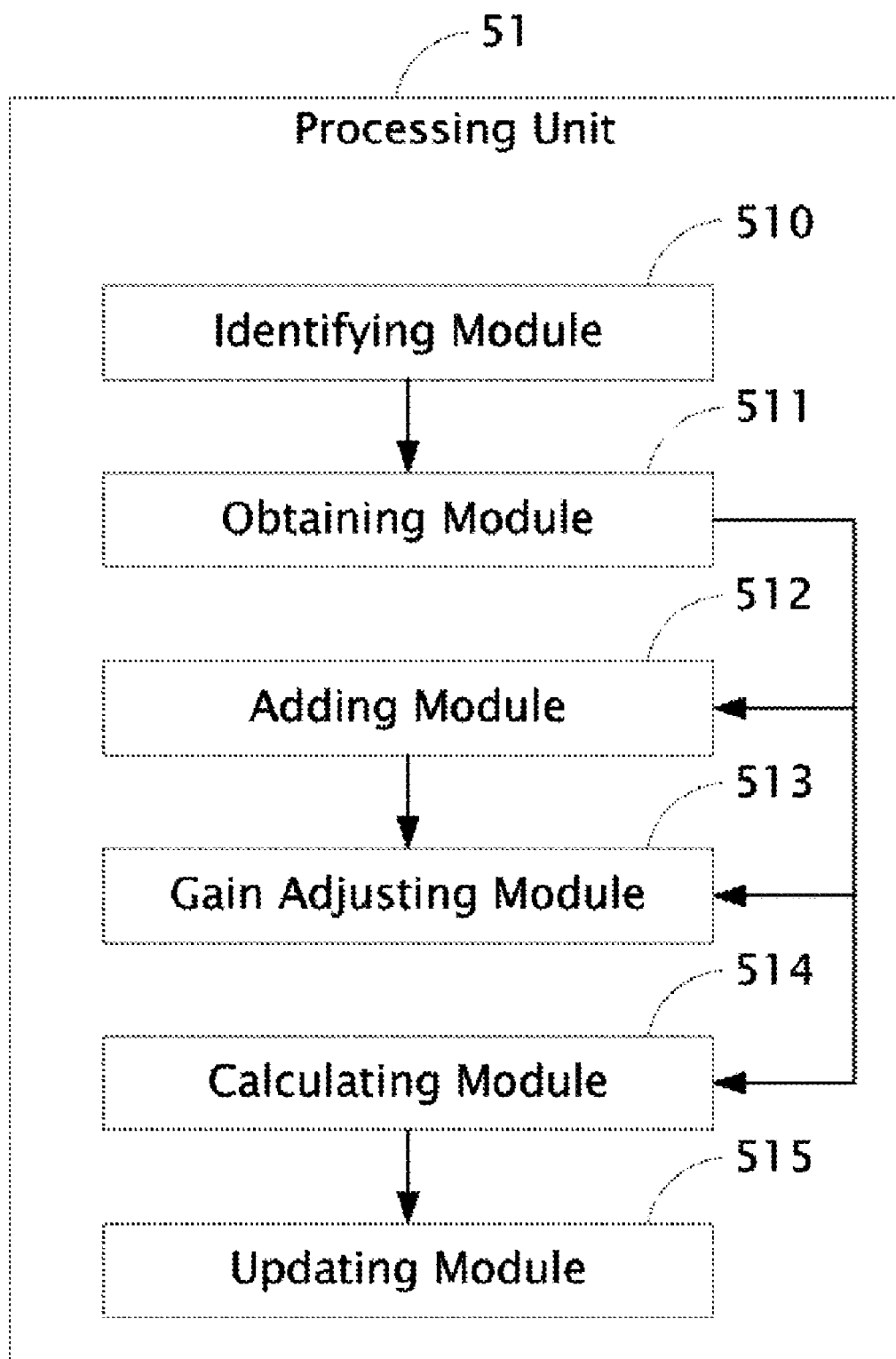
FIG. 6 is a schematic diagram of main function modules of a processing unit of FIG. 5.

Therefore, referring to FIG. 6, in this alternative embodiment, the processing unit 51 further has the function as well as the gain managing unit 17 does in FIG. 1. That is, the processing unit 51 has an identifying module 510, an obtaining module 511, an adding module 512, a gain adjusting module 513, a calculating module 514, and an updating module 515 respectively performing the same functions as the identifying module 170, an obtaining module 171, an adding module 172, a gain adjustment 173, a calculating module 174, and an updating module 175 of the gain managing unit 17.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. An audio processing system with a function of automatic gain control, the system comprising:
    a storage unit for storing a plurality of audio files, and a gain setting table which lists a plurality of genre types with a genre gain value corresponding to each one of the genre types;
    a processing unit for fetching an audio file from the storage unit after receiving a playing command to play the audio file;
    a decoding unit for decoding the audio file and generating digital audio signals;
    a digital/analog converter for converting the digital audio signals to analog audio signals; and
    a gain managing unit comprising:

an identifying module for reading a genre type of the audio file fetched from a tag of the audio file;

an obtaining module for reading a genre gain value of the genre type from the gain setting table;

a gain adjusting module for signaling a gain amplifier to amplify the analog audio signals received from the digital/analog converter by the genre gain value read, and for adjusting a default gain value stored in the storage unit to an adjusted gain value in response to a gain adjusting command;

a calculating module for calculating an integrated gain value by assigning a weight value respectively to the genre gain value and the adjusted gain value, multiplying the genre gain value and the adjusted gain value by the corresponding weight value assigned, thereby obtaining two products, and summing the two products to obtain the integrated gain value; and an updating module for updating the genre gain value of the genre type in the gain setting table with the integrated gain value.

2. The system according to claim 1, wherein the gain managing unit further comprises an adding module, the adding module inserts the genre type read into the gain setting table, if the gain setting table does not list the genre type.

3. The system according to claim 1, wherein the gain managing unit further comprises an adding module which inserts a default gain value stored in the storage unit into the gain setting table as a genre gain value of the genre type read, if the gain setting table does not list the genre gain value of the genre type.

4. An audio processing system with a function of automatic gain control, the system comprising:

a storage unit for storing a plurality of audio files, and a gain setting table, the gain setting listing a plurality of genre types with a genre gain value corresponding to each one of the genre type;

a processing unit for fetching an audio file from the storage unit after receiving a playing command to play the audio file;

a decoding unit for decoding the audio file fetched and generating digital audio signals;

a digital/analog converter for converting the digital audio signals to analog audio signals; and wherein the processing unit comprises:

an identifying module for reading a genre type of the audio file from a tag of the audio file;

an obtaining module for reading a genre gain value of the genre type from the gain setting table;

a gain adjusting module for signaling a gain amplifier to amplify the analog audio signals received from the digital/analog converter by the genre gain value, and for adjusting a default gain value stored in the storage unit to an adjusted gain value in response to a gain adjusting command;

a calculating module for calculating an integrated gain value by assigning a weight value respectively to the genre gain value and the adjusted gain value, multiplying the genre gain value and the adjusted gain value by the corresponding weight value assigned, thereby obtaining two products, and summing the two products to obtain the integrated gain value; and an updating module for updating the genre gain value of the genre type in the gain setting table with the integrated gain value.

5. The system according to claim 4, wherein the processing unit further comprises an adding module which inserts the genre type read into the gain setting table, if the gain setting table does not list the genre type.

6. The system according to claim 4, wherein the processing unit further comprises an adding module which inserts a default gain value stored in the storage unit into the gain setting table as a genre gain value of the genre type read, if the gain setting table does not list the genre gain value of the genre type.

7. An automatic gain control method of an audio processing system, the method comprising steps of:

receiving a playing command to play an audio file;

reading a genre type of the audio file from a tag of the audio file;

reading a genre gain value of the genre type from a gain setting table stored in a storage unit;

decoding the audio file and generating digital audio signals;

converting the digital audio signals to analog audio signals; and signaling a gain amplifier to amplify the analog audio signals by the genre gain value;

receiving a gain adjusting command to adjust a default gain value stored in the storage unit;

adjusting the default gain value to an adjusted gain value;

assigning a weight value respectively to the genre gain value and the adjusted gain value;

multiplying the genre gain value and the adjusted gain value by the corresponding weight value assigned, thereby obtaining two products;

summing the two products to obtain an integrated gain value; and updating the genre gain value of the genre type read from the gain setting table with the integrated gain value.

8. The method according to claim 7, further comprising a step of:

inserting the genre type read into the gain setting table, if the gain setting table does not list the genre type.

9. The method according to claim 7, further comprising steps of:

obtaining a default gain value stored in the storage unit, inserting the default gain value into the gain setting table as the genre gain value of the genre type read, if the gain setting table does not list the genre gain value of the genre type.

* * * * *